United States Patent
Urzi et al.

(10) Patent No.: US 8,521,937 B2
(45) Date of Patent: Aug. 27, 2013

(54) METHOD AND APPARATUS FOR INTERFACING MULTIPLE DIES WITH MAPPING TO MODIFY SOURCE IDENTITY

(75) Inventors: Ignazio Antonino Urzi, Grenoble (FR); Philippe D'Audigier, Grenoble (FR); Olivier Sauvage, Grenoble (FR); Stuart Ryan, Bristol (GB); Andrew Michael Jones, Bristol (GB)

(73) Assignees: STMicroelectronics (Grenoble 2) SAS, Grenoble (FR); STMicroelectronics (Research & Development) Ltd, Marlow, Buckinghamshire (GB)

( * ) Notice: Subject to any disclaimer, the term of this patent is extended or adjusted under 35 U.S.C. 154(b) by 176 days.

(21) Appl. No.: 13/028,383

(22) Filed: Feb. 16, 2011

(65) Prior Publication Data

US 2012/0210093 A1    Aug. 16, 2012

(51) Int. Cl.
*G06F 13/14* (2006.01)
*G06F 13/38* (2006.01)

(52) U.S. Cl.
CPC .................................. *G06F 13/385* (2013.01)
USPC ........................................ 710/305; 710/309

(58) Field of Classification Search
USPC ................. 710/104–110, 305–315
See application file for complete search history.

(56) References Cited

U.S. PATENT DOCUMENTS

| | | | |
|---|---|---|---|
| 6,219,744 B1 | 4/2001 | Bredin et al. | |
| 6,425,054 B1 * | 7/2002 | Nguyen | 711/117 |
| 6,460,105 B1 | 10/2002 | Jones et al. | |
| 6,526,501 B2 | 2/2003 | Edwards et al. | |
| 6,571,308 B1 * | 5/2003 | Reiss et al. | 710/315 |
| 6,895,447 B2 * | 5/2005 | Brewer et al. | 710/11 |
| 7,024,502 B2 | 4/2006 | Horowitz et al. | |
| 7,155,556 B2 * | 12/2006 | Kim et al. | 710/315 |
| 7,689,748 B2 | 3/2010 | Grossman et al. | |
| 7,958,283 B2 | 6/2011 | Islam et al. | |

(Continued)

FOREIGN PATENT DOCUMENTS

| | | |
|---|---|---|
| EP | 1303100 A2 | 4/2003 |
| EP | 1598744 A1 | 11/2005 |

(Continued)

OTHER PUBLICATIONS

EPO Search Report and Written Opinion mailed May 31, 2010 for EP 09178183.1 (5 pages).

(Continued)

*Primary Examiner* — Raymond Phan
(74) *Attorney, Agent, or Firm* — Gardere Wynne Sewell LLP

(57) ABSTRACT

A package includes a die and at least one further die. The die has an interface configured to receive a transaction request from the further die via an interconnect and to transmit a response to the transaction request to said further die via the interconnect. The die also has mapping circuitry which is configured to receive the transaction request including at least first source identity information, wherein the first source identity information is associated with a source of the transaction request on the further die. The mapping circuitry is configured to modify the transaction request to replace the first source identity information with local source identity information, wherein that local source identity information is associated with the mapping circuitry. The mapping circuitry is configured to modify the received transaction request to provide said first source identity information in a further field.

20 Claims, 7 Drawing Sheets

(56) References Cited

U.S. PATENT DOCUMENTS

| | | | |
|---|---|---|---|
| 8,176,492 | B2 | 5/2012 | Manoj et al. |
| 8,189,328 | B2 | 5/2012 | Kanapathippillai et al. |
| 2002/0097733 | A1 | 7/2002 | Yamamoto |
| 2003/0097502 | A1 | 5/2003 | Bacigalupo |
| 2003/0151134 | A1 | 8/2003 | Nishizawa et al. |
| 2004/0088460 | A1 | 5/2004 | Poisner |
| 2004/0252689 | A1 | 12/2004 | Park et al. |
| 2005/0154812 | A1 | 7/2005 | DeWitt et al. |
| 2006/0077730 | A1 | 4/2006 | Jakobs et al. |
| 2006/0095621 | A1* | 5/2006 | Vinogradov et al. ......... 710/100 |
| 2006/0164150 | A1 | 7/2006 | Asano |
| 2006/0190655 | A1 | 8/2006 | Kautzman et al. |
| 2007/0002760 | A1 | 1/2007 | Tiruvallur et al. |
| 2007/0157048 | A1 | 7/2007 | Levin et al. |
| 2007/0260796 | A1 | 11/2007 | Grossman et al. |
| 2007/0299992 | A1 | 12/2007 | Imada |
| 2008/0144411 | A1 | 6/2008 | Tsern |
| 2008/0273527 | A1 | 11/2008 | Short et al. |
| 2009/0079066 | A1 | 3/2009 | Jang |
| 2010/0281308 | A1 | 11/2010 | Xu et al. |

FOREIGN PATENT DOCUMENTS

| | | | |
|---|---|---|---|
| EP | 1688847 | A1 | 8/2006 |
| GB | 2339035 | A | 1/2000 |
| JP | 59058565 | A | 4/1984 |
| WO | WO-9910814 | A1 | 3/1999 |
| WO | WO-2005043838 | A1 | 5/2005 |
| WO | WO-2005071556 | A1 | 8/2005 |
| WO | WO-2007139893 | A2 | 12/2007 |
| WO | WO-2008000059 | A1 | 1/2008 |
| WO | WO-2008076790 | A2 | 6/2008 |

OTHER PUBLICATIONS

EPO Search Report and Written Opinion mailed Apr. 4, 2011 for EP 10305123.1 (4 pages).

EPO Search Report and Written Opinion mailed Apr. 4, 2011 for EP 10305122.3 (4 pages).

English Translation Abstract for JP 59058565 published on Apr. 4, 1984.

Se-Joong Lee, Kangmin Lee, Seong-Jun Song, and Hoi-Jun Yoo, "Packet-Switched On-Chip Interconnection Network for System-On-Chip Applications," IEEE Transactions on Circuits and Systems—II: Express Briefs, vol. 52 No. 6, Juen 2005, pp. 308-312.

Dobkin (Reuven) Rostislav, Victoria Vishnyakov, Eyal Friedman, Ran Ginosar, "An Asynchronous Router for Multiple Service Levels Networks on Chip," VLSI Systems Research Center, Technion—Israel Institute of Technology, Haifa 32000, Israel, Proceedings of the 11th IEEE International Symposium on Asynchronous Circuits and Systems (ASYNC'05), 10 total pages.

King L. Tai, "System-In-Package (SIP): Challenges and Opportunities," Bell Laboratories, Lucent Technologies, Murray Hill, NJ, copyright 2000 IEEE, pp. 191-196.

Ankur Agarwal, Cyril Iskander, Ravi Shankar, "Survey of Network on Chip (NoC) Architectures & Contributions," Journal of Engineering, Computing and Architecture, ISSN 1934-7197, vol. 3, Issue 1, 2009, XP002573800, 15 total pages.

Martin Goetz, "System on Chip Design Methodology Applied to System in Package Architecture," Alpine Microsystems, Dallas, TX 75225, 2002 Electronic Components and Technology Conference, pp. 254-258.

Dr. Antoni Ferre, Mr. Joan Fontanilles, "Devices and Microsystems in the Automotive Industry," Lear Automotive EEDS Spain St., European Tech. Center, Pusters 54 E43800 Valls, pp. 19-22.

Dr. Robert C. Pfahl, Jr., iNEMI, Joe Adam, Skyworks, "System in Package Technology," iNEMI—International Electronics Manufacturing Initiative, 25 total pages.

* cited by examiner

| ADDR 120 | SIZE 122 | IP SRC 124 |

FIG. 6A

| ADDR 120 | SIZE 122 | DIE A SRC 126 |

FIG. 6B

| ADDR 120 | SIZE 122 | IP SCR 128 | ICN_INFO=DIE A SCR 130 |

FIG. 6C

| ADDR 120 134 | SIZE 122 | DIE B SCR 132 | ICN_INFO=DIE A SCR 130 |

FIG. 6D

| R_DATA 134 | DIE B SCR 132 | ICN_INFO=DIE A SCR 130 |

FIG. 6E

| R_DATA 134 | IP SCR 128 | ICN_INFO=DIE A SCR 130 |

FIG. 6F

| R_DATA 134 | DIE A SCR 126 |

FIG. 6G

| R_DATA 134 | IP_SCR 124 |

METHOD AND APPARATUS FOR INTERFACING MULTIPLE DIES WITH MAPPING TO MODIFY SOURCE IDENTITY

TECHNICAL FIELD

The present invention relates to a die, a package comprising a die and a further die, and a method.

BACKGROUND

An ongoing trend is for the feature size in silicon technology to decrease. For example, decreasing feature sizes in CMOS (complementary metal-oxide-semiconductor) silicon processing allows digital logic to shrink in each successive fabrication technology. For example, if a digital logic cell is implemented with 90 nm (nanometer) technology, that same cell would take 55% less area if implemented with 65 nm technology.

SUMMARY

According to one aspect of the present invention, there is provided a die for use in a package comprising said die and at least one further die, said die comprising an interface configured to receive a transaction from said further die via an interconnect and to transmit a response to said transaction to said further die via said interconnect; and mapping circuitry configured to receive at least first source identity information of said received transaction, said first source identity information associated with a source of said transaction, and to modify said transaction to comprise local source identity information as source identity information for said transaction.

According to another aspect of the present invention, there is provided a method comprising receiving at an interface of a die, a transaction from a further die, said die and further die being provided in a package; receiving at least first source identity information of said received transaction, said first source identity information associated with a source of said transaction; modifying said transaction to comprise local source identity information as source identity information for said transaction; and transmitting via said interface, a response to said transaction to said further die.

BRIEF DESCRIPTION OF DRAWINGS

For an understanding of some embodiments of the present invention and as to how the same may be carried into effect, reference will now be made by way of example only to the accompanying Figures in which:

FIG. 1b shows a schematic side view of the package incorporating two dies of FIG. 1a;

FIGS. 6a to 6h show the format of messages in an embodiment of the invention.

DETAILED DESCRIPTION OF EMBODIMENTS OF THE INVENTION

Figure 1A:
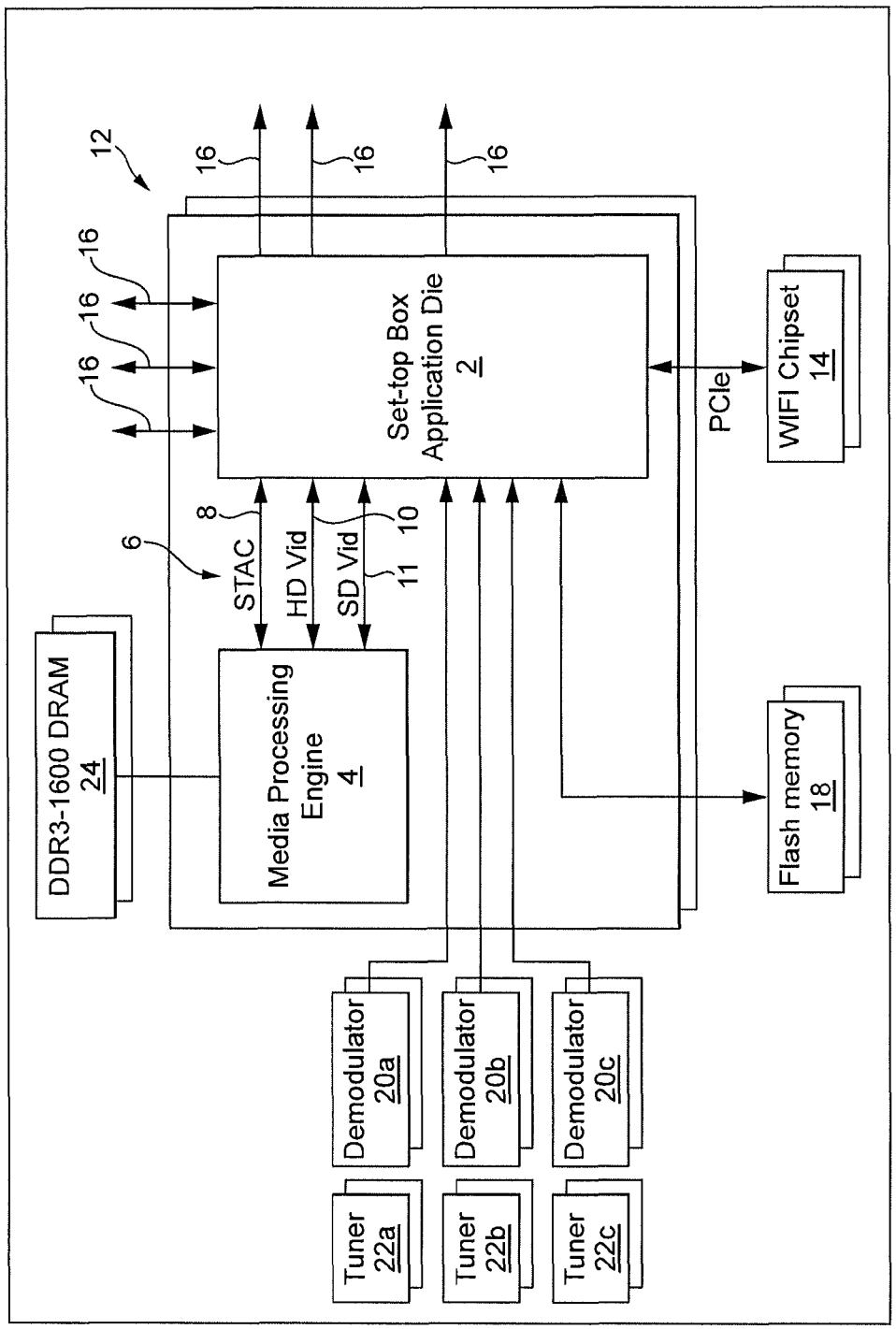
FIG. 1a shows a schematic plan view of a package incorporating two dies and circuitry to which the package is connected.

In embodiments of the present invention, a plurality of integrated circuit dies is incorporated within a single package. In the following examples, a single package having two dies is described. However, it should be appreciated that this is by way of example only and more than two dies may be provided in some embodiments of the invention.

A communication channel is provided between the systems on the different silicon dies. The communications channel or on-chip interconnect may provide high bandwidth and low latency. In some embodiments, various signals are integrated onto the communication channel in order to reduce pin count and power consumption. Some embodiments of the present invention may provide a universal communication channel which allows the interface to retain their compatibility with the channel that allows for different implementations of the interfaces.

By allowing more than one die within a single package, decoupling of the analogue blocks from the digital blocks can be achieved. For example, the analogue circuitry can be provided on one die and the digital circuitry can be provided on a different die. In this way, the analogue die may have its required voltage and/or transistor gate oxide thickness while the digital part of the die can use a different voltage and/or transistor gate oxide thickness. It should be appreciated that in some embodiments, the digital die may predominantly contain digital circuitry and a relatively small amount of analogue circuitry and/or the analogue die may predominantly contain analogue circuitry and a relative small amount of digital circuitry.

Alternatively or additionally, each die may be designed to provide a particular function which may require various different mixes of analogue and digital circuitry in the implementation of that particular function. In some embodiments, this may mean that the same die or same design for a die may be used in different packages. By introducing this modularity, design time may be reduced.

In the following, a single package comprising two or more dies will be referred to as a system in package.

By way of example only, one system in package may comprise: a 32 nanometer die containing high speed CPUs (central processing units), one or more DDR3 controllers and other elements; and a 55 nanometer die containing analogue PHYs (physical layer devices). As the analogue circuitry is contained on a different die to that containing the digital circuitry, the 32 nanometer die is able to maximize the benefits from the reduction in size.

In the following example, a system in package embodiment is described for a set top box. In particular, in the same package are a set top box application die and a media processing engine 4. However, this is by way of example only. For example, one package could comprise an RF (radio frequency) die and a TV tuner die. Alternatively, a wireless networking PHY layer die may be incorporated in the same package as an RF die.

Alternative embodiments may be used in a wide variety of different contexts. The following is a non exhaustive list of where embodiments of the invention may be used: mobile phone chips; automotive products; telecoms products; wireless products; gaming application chips; personal computer chips; and memory chips.

Embodiments of the invention may be used where there are two or more dies in a package and the dies are manufactured in different technologies. Embodiments of the invention may alternatively or additionally be used where it is advantageous for at least one of the dies to be certified, validated or tested independently for conformance to some standard. Embodiments of the invention may alternatively or additionally be used where one of the dies contains special-purpose logic to drive specific wireless, optical or electrical interfaces so that the other die(s) can be manufactured independently and not incur any cost associated with the special purpose logic. Embodiments of the invention may alternatively or additionally be used where one of the dies contains information (for example encryption information) which is to be withheld from the designers/manufacturers of the other dies. Embodiments of the invention may alternatively or additionally be used where one of the die contains high-density RAM or ROM and it is preferable to separate this from standard high speed logic for reasons of fabrication yield and/or product flexibility.

Reference is now made to FIGS. 1a and b which shows a system in package 12. The system in-package 12 comprises a set top box application die 2 and a media processing engine die 4. The two dies, 2 and 4, are connected to each other via an interface 6. The interface 6 comprises a bidirectional point-to-point-interface 8, a HD (high definition) video output 10 and a SD (secure digital) video output 11 from the media processing engine 4 to the set top box application die 2.

The dies 2 and 4 are connected to circuitry outside the system in package. The set top box application die 2 is connected to a Wi-Fi chipset 14 and to a FLASH memory 18. The set top box application die 2 also comprises inputs/outputs 16. It should be appreciated that the number of inputs/outputs shown is by way of example only and more or less than six inputs/outputs may be provided. Each of these inputs/outputs may be both an input and an output, just an input or just an output. The set top box application die 2 is also connected to three demodulators 20a, 20b and 20c. Each of the demodulators is connected to a respective tuner 22a, 22b and 22c.

The media processing engine die 4 is connected to a DDR3-DRAM 24.

Figure 1B:
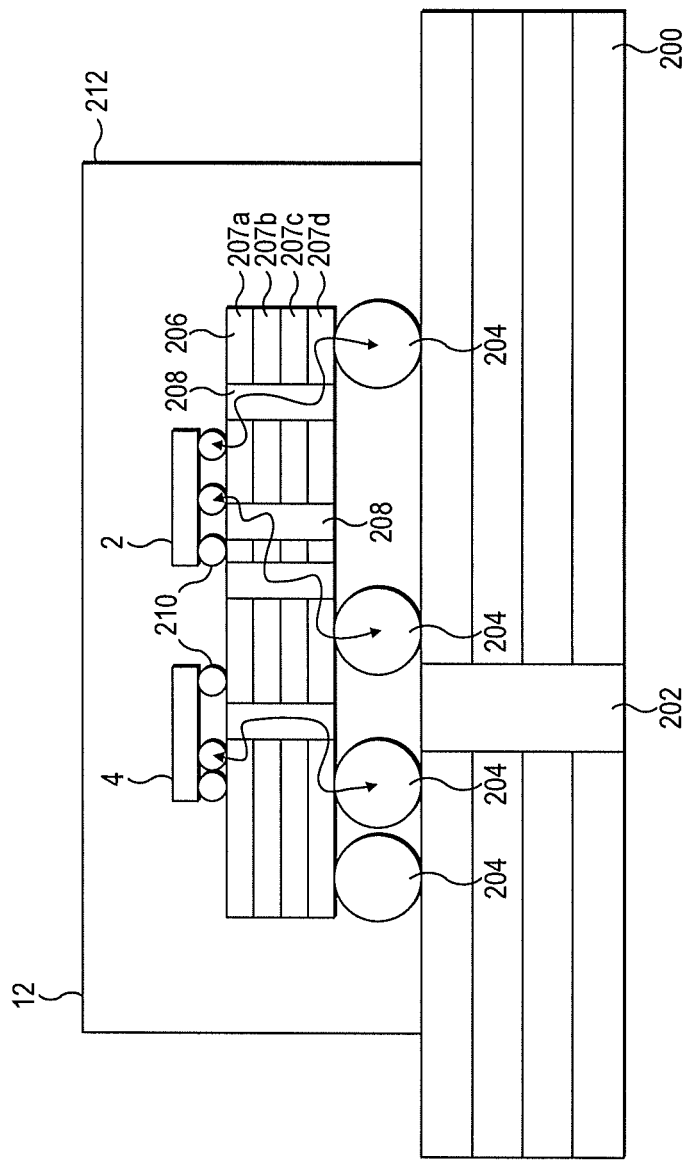

Reference is made to FIG. 1b which shows the system in package of FIG. 1a, but from the side. Again, this is a schematic representation of the system in package 12. The system in package 12 comprises PCB (printed circuit board) layers 200 with vias 202 extending there though. A substrate structure 206 is supported by balls 204 of solder, the solder balls 204 being between the PCB 200 and the substrate structure 206. The substrate structure 206 is provided with vias 208 there through. The substrate structure 206 may be of fiberglass. The substrate structure 206 has layer 0 referenced 207d which contacts the solder balls 204. Next there is the second layer, layer 1 referenced 207c, which is the power layer. Next there is the third layer, layer 2, referenced 207b, which is the ground layer. Finally there is the fourth layer, layer 3, referenced 207a, which is the signal layer which is in contact with solder balls 210.

The solder balls 210 on the side of the substrate structure opposite to that facing the PCB layers 200 support the dies 2 and 4. As is known, electrical paths are provided by the solder balls and the vias. The interface 8 is defined by paths from one die to the other die comprising: solder balls connected to the one die; the solder balls connected to the one die being connected to the signal layer of the substrate structure 206, the signal layer of the substrate structure being connected to respective solder balls associated with the other die. In some embodiments the connection path may include vias in the substrate structure. It should be appreciated that this is only one example of a possible implementation of the interface and the connections of the interface 8 may be implemented in a number of alternative ways.

The elements which are supported by the PCB layers 200 are then encapsulated in a plastic molding 212 to provide a system in package.

Some embodiments of the invention use a common interface which avoids the need for a relatively large number of wires dedicated to particular control signals. Some embodiments are such that modification of the die to take into account new or different control signals is simplified. Some embodiments of the invention are such that testing, validation and packaging of the die is simplified and the inter-die communication can be simplified.

Figure 2:
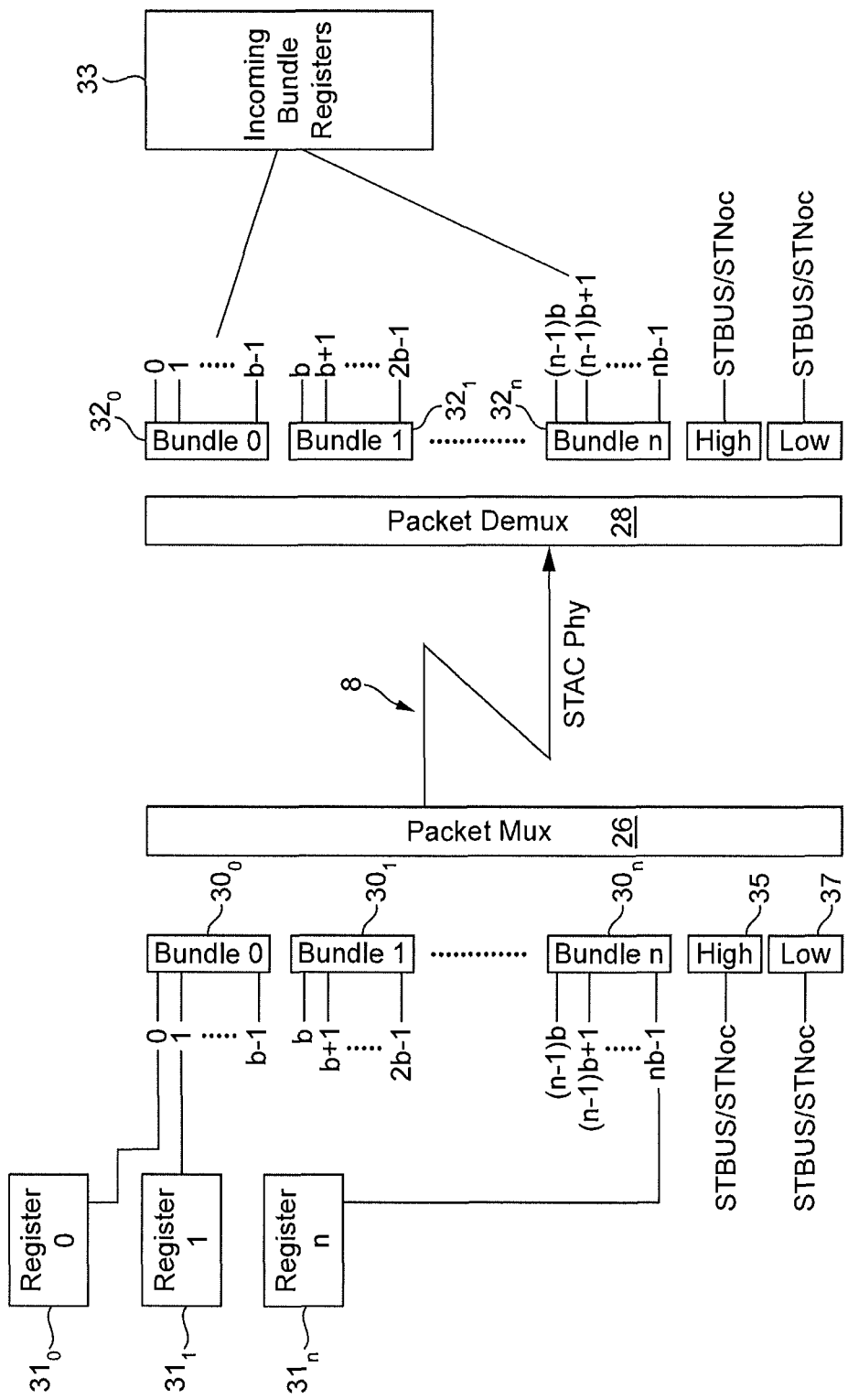
FIG. 2 schematically shows the interface between the two die of FIG. 1.
Figure 3:
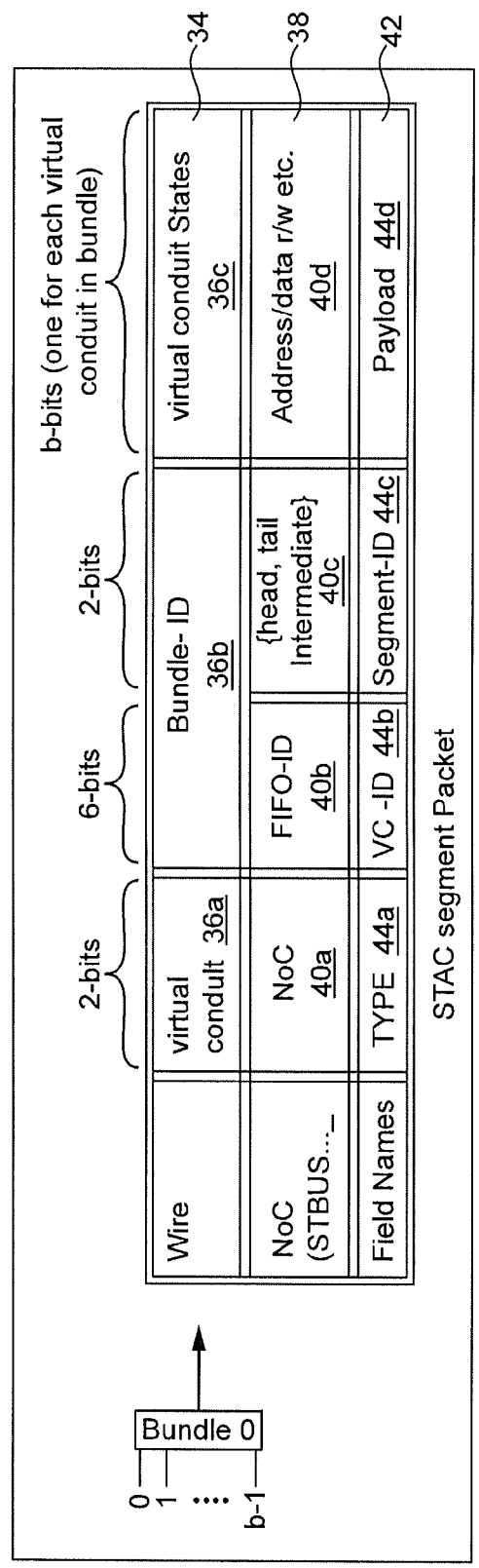
FIG. 3 shows schematically different types of the packets transmitted from one die to the other.

Reference will now be made to FIGS. 2 and 3. In the following, a virtual conduit is described in which control signals such as interrupts, handshakes, reset and other narrow signals can be multiplexed with a standard memory transaction. In a typical system-on-chip (SoC) system the majority of communication is performed over a bus interconnect, via memory mapped transactions. The Bus/NoC (network-on-chip) is wide (e.g. 80 bits for NoC, 100+ bits for the bus). These narrow 'out of band' signals convey information on typically a small number of fixed function wires; within a SoC there may, however, be many of them. It should be appreciated that these numbers are by way of example only.

The memory mapped transactions will typically be issued from an initiator port or the like. The transactions issued from the initiator port will include an address which is used by a router to route the transactions. On the receive side, the transaction is received by a target port or the like and then routed by a router to a destination depending on the address information. The memory transactions can be considered to be routed point-to-point transactions. In contrast a control signal is point-to-point, without requiring any routing. In other words a line or wire on one die is mapped to a corresponding line or wire on the other die.

For the control signals, a signal change on a wire in one die is communicated via the interface and associated circuitry such that there is corresponding signal change on a corresponding wire in the other die in such a manner as to be functionality transparent to the entities which communicate using this wire.

Examples of control signals include, but are not limited to, interrupts, handshakes (e.g. request, acknowledge pairs), resets, power state change requests, enable/disable signals, alarm signals, synchronization signals, clock signals, status signals, functional mode setting signals, sense signals, presence detect signals, power status signals, endian signals, security mode signals, LED (light emitting diode) control, external chip control (e.g. chip select, write protect, chip enables etc) and signals taken off-chip (i.e. outside the package) to control associated electronic items.

It should be appreciated that FIGS. 2 and 3 are used to illustrate the communication between the dies 2 and 4 of FIG. 1.

In some embodiments of the present invention, the majority of the communication between the two dies 2 and 4 connected by the inter-die interface 8 will be read and write transactions to the memory address space associated with the respective dies. This traffic will generally be two-way traffic. However, there may also be communication in the form of the assertion and/or de-assertion of interrupt lines, DMA (direct memory access) handshakes, reset requests and acknowledgments, power down requests, and/or the like. These signals can additionally or alternatively include any one or more of the controls signals mentioned above. These latter signals are the control signals discussed previously and are sometimes referred to out of band signals (OOB).

In one embodiment of the present invention, the memory transactions (for example read and write) are carried by a sequence of packets over the inter-die interface 8. In this regard, reference is made to FIG. 2 which shows the inter-die interface.

A packet multiplexer 26 is provided on each of the dies. This is connected to the inter-die interface 8, at the other end of which is a respective packet de-multiplexer 28. Each die thus comprises a packet multiplexer for the traffic going to the other die and a packet de-multiplexer for the traffic received from the other die. For simplicity, only one packet multiplexer and de-multiplexer is shown. As can be seen, the packet multiplexer receives an input from a respective bundle $30_0$-$30_N$. In the example shown, there are N+1 bundles each of which has b wires. In this example, each bundle has the same number of wires. However in alternative embodiments of the invention, each bundle may have different numbers of wires. Each wire is connected to a respective register $31_{0-n}$ which holds the current signal value associated with that wire.

Each wire is allocated a predefined position within one bundle. One or more respective signals are associated with a particular wire. Thus a particular signal will be allocated a particular wire in a particular bundle of wires. For example, the power down request will be allocated wire number b+1 in bundle 1. Each bundle is arranged to be transmitted as a single packet together with a bundle identifier which is referred to as a virtual channel identifier.

The packet may be atomic.

The packet multiplexer 26 receives an input in the form of packets from one or more of the bundles. The packet multiplexer also receives memory transactions which have been split into packets. The packet multiplexer multiplexes the packets output by the bundles and the memory transaction packets and transmits them across the point-to-point interface 6 to the packet de-multiplexer 28.

The packet de-multiplexer 28 uses the bundle identifier of the bundle packets to direct each received bundle packet to a respective incoming bundle circuitry $32_0$ to $32_n$. There is a respective bundle circuitry 32 associated with each bundle from the transmit side. The respective incoming bundle circuitry 32 associate each bit in the received packet with the associated output wire and output the associated value to the associated incoming bundle registers 33. In FIG. 2, the bundle registers 33 are shown as a single block for simplicity. In practice a register is associated with each wire.

There may be one-to-one mapping. For example, if wire 1 on bundle 0 has a particular signal value on the transmit side, the output 1 of the register for bundle 0 will have that signal value. In alternative embodiments, there may be a more complicated mapping between the input on a particular wire of a particular wire and the output of the register. For example there may not be one to one correspondence between wires of a particular bundle and a given register. The wires of one bundle may correspond to respective outputs of different registers.

In one embodiment two or more wires may map to a fewer number of wires. Alternatively one or more wires may map to a greater number of wires.

In one embodiment of the invention, the state of each wire in the bundle is not continuously transmitted. The state of the wire is sampled at regular intervals and these samples are transmitted across the interface 8 in a respective wire packet along with data traffic. The sample may be used to specify the state of the respective register 31 which holds the state of each out of band signal on the transmit side of the interface. In the embodiment shown, there are n+1 registers $31_{0-n}$.

The number of registers may be the same as the number of wires or less than the number of wires. In one embodiment, each register is connected to a single wire. Alternatively or additionally, one register may be connected to two or more wires. Where a register connected to more than one wire a plurality of bits may be used to represent information such as a state or the like.

In one embodiment, the transmission in the interface 8 is performed bi-directionally so that the wires can be virtually connected from either side. As mentioned each die has a packet multiplexer and a packet de-multiplexer. The packet multiplexer and de-multiplexer may share the same physical interface so that a die will receive and transmit via a common interface, that is on the same physical connection. Alternatively, a packet multiplexer and de-multiplexer on one die have separate interfaces. In other words, a die will receive and transmit on different interfaces.

The interface can be regarded as a set of wires or connectors extending between the two dies. The wires may be subdivided into one or more lanes. Where the wires are subdivided into lanes, the or each lane may be arranged to carry packets.

It should be appreciated that in embodiments of the invention, the same connectors or wires which carry the memory transaction packets also carry the bundle packets The interface 8 may be considered in some sense universal and is capable of carrying different classes of communication such as signals (control signals) and busses (memory transactions).

The interface 8 can be implemented in serial or parallel form. The data in a packet may be transmitted serially or in parallel. It is preferred that the interface 8 be a high speed link.

In a preferred embodiment of the present invention, the sampling rate, the number of bundles transmitted and/or the priority of transmission of these bundles can be configured as required.

In one embodiment, the states of signals comprising each wire bundle can be periodically sampled at a rate which is separately configurable for each bundle. In other words, each bundle can have a different sampling rate associated therewith.

Each bundle sample is formatted into a packet as illustrated in FIG. 3. The bundle sample may be formatted in the respective bundle 30 where the additional information to packetize the bundles samples are added. In an alternative embodiment, the multiplexer may incorporate circuitry which is configured to perform or complete the packetization.

The bundle sample packet is referenced 34. The first field 36a of the bundle sample packet 34 comprises information to identify the packet to the receiving logic as a wire bundle packet. In this example, this field of the packet comprises two bits. However, it should be appreciated that in alternative embodiments of the invention, more or less than two bits may be used for this field. This field is followed by a bundle identity field 36b. The bundle identity field allows the packet to be routed to the appropriate bundle circuitry 32 on the receiving die. This therefore identifies the bundle from which the packet originates. In this example, the field comprises 8 bits. However, it should be appreciated that more or less than 8 bits may be used. The packet payload 36c comprises b bits, one for each input wire to the bundle on the transmitting side.

By way of example only, b may be, for example 80 bits. In one implementation, there may be four bundles. The appropriate payload is routed to the appropriate bundle circuitry 32 on the receive side, shown in FIG. 2 using the bundle identification. The bundle circuitry 32 will map the bundle payload to the appropriate incoming bundle register 33.

It should be appreciated that the sizes of the respective fields of the packet may be changed in different embodiments of the invention. It should be appreciated that the order of the fields may also be changed in different embodiments of the invention.

In one embodiment of the present invention, each bundle is sampled at a rate of $(CLK)/2^N$ where CLK is the clock rate and N is one of: (2, 3, 4 ... 31). For example, a clock CLK of 400 MHz and a bundle configured with N=8 would sample that bundle at 1.56 MHz and would produce a wire packet for that bundle every 640 nanoseconds.

In one embodiment of the present invention, at any given time there may be none, one or more than one packet ready for transmission. The packet multiplexer 26 illustrated in FIG. 2 will comprise logic to arbitrate, if necessary, and decide on the transmission order of the packets. This will typically produce a time division multiplexed of bundle packets and memory packets on the physical transmission on the interface between the first and second die.

As mentioned previously, the interface 8 is also used for the memory transactions such as memory reads and/or writes. An example of the memory transaction packet 38 which is sent across the same interface 8 is also shown in FIG. 3 and is referenced 38. The first field indicates that the packet is a NoC (network-on-chip) packet. The second field 40b indicates the FIFO-ID (first-in first-out identifier). As shown in FIG. 2, the die comprises queues implemented by FIFOs. In the embodiment shown in FIG. 2, there are two FIFOs which provide a high priority queue 35 and a low priority queue 37. The interconnect delivers the memory transaction to the appropriate FIFO depending on which queue the transaction belongs to. There can be more than two queue classifications in alternative embodiments. The third field 40c indicates if the packet is a head packet, a tail packet or an intermediate packet. One memory instruction may be sent in a plurality of different packets.

The final field is the payload field 40d which includes the address and/or data to be written or read and/or the associated instruction and/or the transaction attributes of belonging to the protocol used on chip to perform memory transactions. The NoC field is allocated 2 bits, the FIFO-ID field is allocated 6 bits, information as to whether the packet is a head, a tail or intermediate packet is allocated 2 bits and the payload is allocated B bits. It should be appreciated that the actual sizes of the respective field is by way of example only and alternative embodiments may have different sizes for the fields.

As can be seen, the wire packet 34 and the NoC 38 packet have the same format as represented by the general packet format 42. The first 2 bits 44a represent the type of the packet. The second 6 bits represents the VC-ID 44b (virtual channel-identity). This is followed by the segment identifier 44c and the payload 44d. The type is allocated 2 bits, the VC-ID 44b is allocated 6 bits, the packet ID segment ID 44c is allocated 2 bits and the payload 44d is allocated B bits.

In one modification, a time slot structure may be used where packets are allocated to a particular time slot. This may be controlled by the packet multiplexer or control circuitry associated therewith. Time slots could be assigned to particular wire bundle packets or to memory transaction packets belonging to a particular priority queue.

In embodiments of the present invention, the packets may be sent serially or in parallel. One embodiment of the present invention involves transmitting the packets in a narrow parallel form with, for example, seven or fifteen wires.

The packets, when received are latched into the bundle circuitry 32 on the receiving side. Once latched, the incoming bundle circuitry 32 causes the values to be stored to the appropriate register 33. The signals can then be asserted to where the incoming signals need to be mapped on the incoming die. For example, interrupts will typically be mapped directly to the interrupt controller of the main CPU.

The packet/bundle mapping is performed in a simple one to one manner without permutation, in one embodiment of the invention. This means that wire W of bundle B on the outgoing bundle is mapped to wire W of bundle B on the incoming bundle circuitry 32 for all implemented values of W and B.

In embodiments of the present invention, the initiator source identifier (SRC) in the interconnect bus may be implemented using a field of "n" bits that is carried along the bus together with the other information the build a bus transaction such as address, data, size, opcode, etc.

When the system on chip interconnect, i.e. bus, is split effectively in two or more dies the overall system on chip source map is, in embodiments of the present invention, set up such that there is no ambiguity for the response traffic routing. The initiator is on one die and the target is on another die. Embodiments of the present invention are such that the different dies may be independently developed, but nevertheless be such that incorporating two or more such dies into a common package is simplified. The package thus functions as a single entity but the dies can be independently designed and easily integrated.

Embodiments of the present invention therefore may allow the designing of the interconnects on the respective dies with two independent source identifier maps but at the same time allowing full interoperability between the dies.

Figure 4:
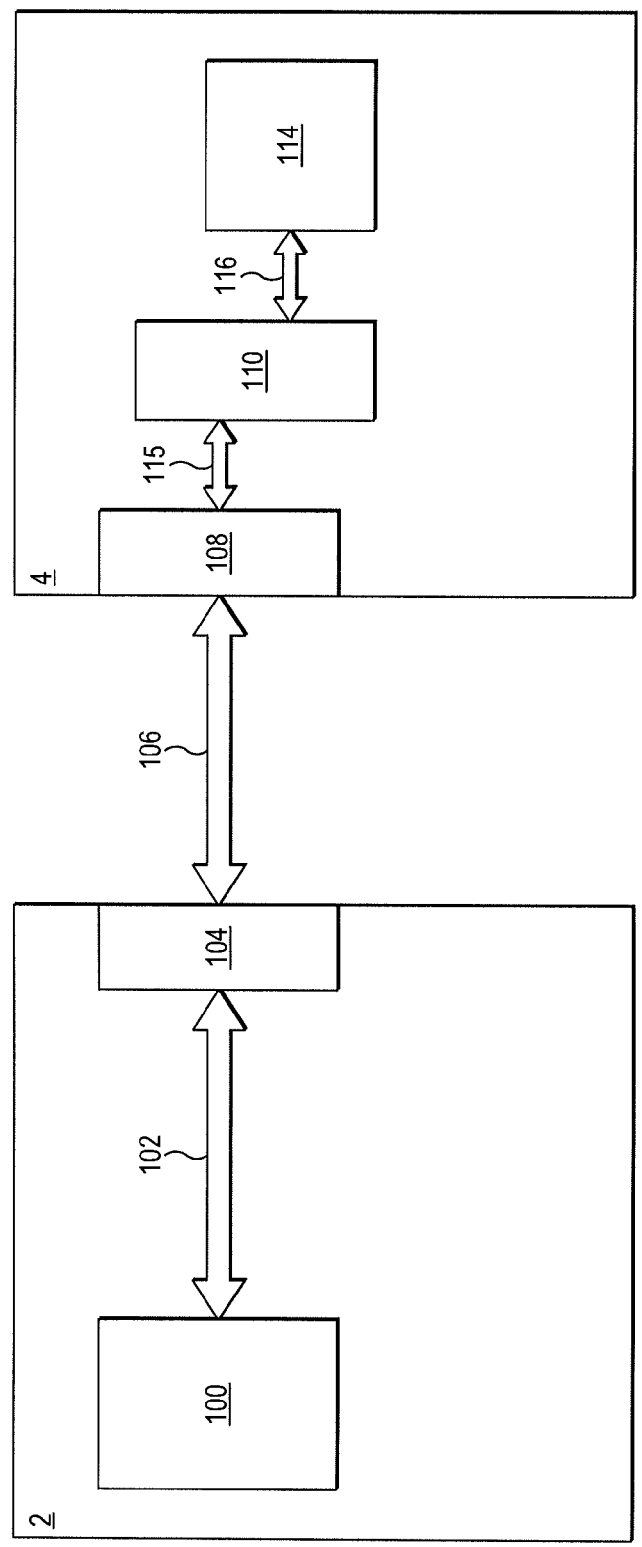
FIG. 4 shows two dies, including respective circuitry, die embodying the present invention.

Reference is now made to FIG. 4 which schematically shows two dies embodying the present invention. In the example shown, the first die 2 is the initiator of a transaction while the second die 4 is the recipient of the transaction and generates the response which is sent back to the initiator. It should be appreciated that in practice, each die will both be an initiator and a responder so that the circuitry shown schematically in relation to die 4 will also be present in die 2 and the circuitry shown schematically in die 2 will also be present in die 4.

It should be appreciated that separate interfaces may be provided in dependence on whether the die is acting as an initiator or a responder. Alternatively, common interface circuitry may be used regardless of whether or not the die is acting as an initiator or a responder.

Likewise, the interconnect between the dies may be shared by the initiation and response traffic provided to and from a die. Alternatively, the initiator traffic from one die may use one interconnect and a separate interconnect may be provided for the response traffic to that one die.

In more detail, FIG. 4 comprises an initiator 100 which may be a processor or the like. The initiator 100 may initiate a transaction which requires a response. This transaction can be any suitable transaction and may be, for example a memory transaction. In the example given, the transaction is a read request. However, this is by way of example only. Other examples of request are a write request. The message which is provided by the initiator 100 can be seen from FIG. 6a. It should be appreciated that the transactions discussed is by way of example only and the transaction may be any transaction where an initiator requires a response from a target on a second die. The response may be a simple acknowledgement or grant, or may additionally or alternatively require some data.

The message may be in the form of a packet or may take any other suitable format. The message comprises a first field 120. This field 120 comprises the memory address which is to be read. This address field will identify a unique location on the second die. The address information will thus be sufficient to ensure that the packet is routed to the second die and that the appropriate memory location on the second die will read.

The second field 122 defines the size of the packet. The third field 124 has the source identifier 124 of the initiator 100. For example the initiator 100 may have for example n source identifiers associated therewith. One of the n source identifiers is used. Typically the source identifiers will be from the set of: 0, 1 . . . n−1. n can have an integer value of 1 or more.

The initiator 100 is connected to the interconnect bus 102 of the first die 2. It should be appreciated that in embodiments of the present invention, the interconnect bus 102 may be connected to a number of other elements on that die which have been omitted for clarity. The interconnect bus 102 is connected to an interface 104. Alternative forms of connection between the interface 104 and initiator 100 may be used in alternative embodiments of the invention.

The interconnect 102 is arranged to modify the packet of FIG. 6a and this is shown in FIG. 6b. The first field is the address field 120, as in FIG. 6a. Likewise, the second field 122 is the size field, again as in FIG. 6a. The third field 126 includes a modified version of the source address 124. Typically a die will have more than one initiator. For example a first initiator may use a range of source identifiers of 0 to n−1 and a second initiator may use a range of source identifiers of 0 to m−1. In one embodiment, the interconnect 102 adds no offset to the source identifiers from the first initiator and an offset of n to the source identifiers of the second initiator. In this way the source of each transaction is uniquely identified. The modified version of the address means that the initiator is identified as well as the particular source address of that initiator. Thus the offset added to the source address is dependent on which initiator is providing the transaction. In this way the identity provided in field 126 will uniquely identify the initiator and the source address within the initiator.

The packet shown in FIG. 6b is put by the interface 104 onto the interconnect 106. The interconnect 106 provides a connection between the first and second dies 2 and 4 respectively.

The packet shown in FIG. 6b is therefore received by an interface 108 of the second die 4. The interface 108 is arranged to send the received packet to a mapper 110. The mapper 110 is arranged to modify the packet. In one alternative embodiment, this function may be incorporated in the interconnect 108. This modified packet is shown in FIG. 6c. The first field is the address field 120 as discussed for example in relation to FIG. 6a. The second field shown is the size field 122 which is similar to the size field shown in FIGS. 6a and 6b. However it should be appreciated that the value in this field may be altered if the size of the packet has been altered.

The third field 128 represents a new source identifier which is assigned by the mapper 110 and which has a unique and fixed value, regardless of the source of the transaction. This same value is used for received transactions from the first die when they reach the second die. This new source identifier value is used on the second die to ensure that the response is routed back to the mapper 110, as will be discussed later. Alternatively or additionally the new source identifier will identify different circuitry to which the response is to be routed before being routed back to the first die.

In the fourth field 130, the source identifier from the first die is included in a new user defined field of the interconnect transaction. This field comprises the first die source identity and includes the information which was included in the third field 126 shown in FIG. 6b. This is to allow the response to be routed back to the first die.

The packet shown in FIG. 6c is put onto the bus 116 of the second die 4.

The interconnect bus 116 will modify the packet. The modified packet is shown in FIG. 6d. The first field, the second field and the fourth field are as shown in FIG. 6c. However, the third field is modified to include a modified version of the local source identifier. In a similar manner to that described in relation to FIG. 6b and for the same reasons, an offset is added so that the modified local source identifier for the second die is provided. This offset will allow the mapper to be uniquely identified from other sources on the second die. The mapper could be regarded as being or at least analogous to an initiator in this regard.

Using the address information included in the packet, the bus 116 will ensure that the memory transaction is routed to the memory circuitry 114. The memory circuitry 114 will ensure that the requested information is, for example read out. The packet provided by memory circuitry 114 is put onto the bus 116 is shown in FIG. 6e. The packet will comprise a first field 134 which comprises the requested data. The second field 132 comprises the modified local source identifier, as shown in the third field of FIG. 6d. The third field contains the same information as the fourth field of the packet as shown in FIG. 6d. Using the modified local source identifier, the response can be directed to the mapper.

The interconnect bus 116 is arranged to modify the packet put by the memory circuitry 114 onto the bus to the format shown in FIG. 6f. The first and third fields are the same as shown in FIG. 6e. The second field is modified to insert instead the local source identifier for the second die, as discussed in relation of third field of FIG. 6c, in other words to remove the offset. The local source identifier is used to route to response to a particular address of the mapper.

The mapper 110 receives the packet shown in FIG. 6f and provides the packet as shown in FIG. 6g. This response packet consists of a first field with the requested data 134 and a second field which includes the original first die source identity, that identity being the identity as discussed in relation to the third field of the packet of FIG. 6b. That packet is transmitted across interconnect 106.

The packet is received by the interface 104 of the first die which causes the packet to be modified to the format shown in FIG. 6h. In particular, the first field comprises the requested data 134 and the second field comprises the local source identifier 124 as discussed in relation to the third field of FIG. 6a. The offset is thus removed. This response is then routed to the particular address of the initiator 100 which sent the original request.

Thus, the source identifier used in the first die is not treated as a source identifier in the second die and vice versa. The first die identifier is carried in the packet in the second die inside a user defined field of the interconnect transaction, this being the field containing information 130. This information is used to allow the response to be routed back to the first die. In the second die, a new source identifier is assigned to the inter-die request i.e. the request from the first die. A unique and fixed source identifier value (that is a common value) is assigned by the mapper module in the second die, for any transactions from the first die when the transaction is received by the second die. This mapping is reversed for those response transactions leaving the second die and going back to the first die. The source identifier assigned by the mapper 110 is used to ensure the response is routed back to the mapper. The mapper 110 is also arranged to re-assign the original source identifier carried inside the packet to the response transaction before the response transaction leaves the second die. The original source identifier value of the first die is then used for local routing in the first die of the response transactions which are returned from the second die.

Figure 5:
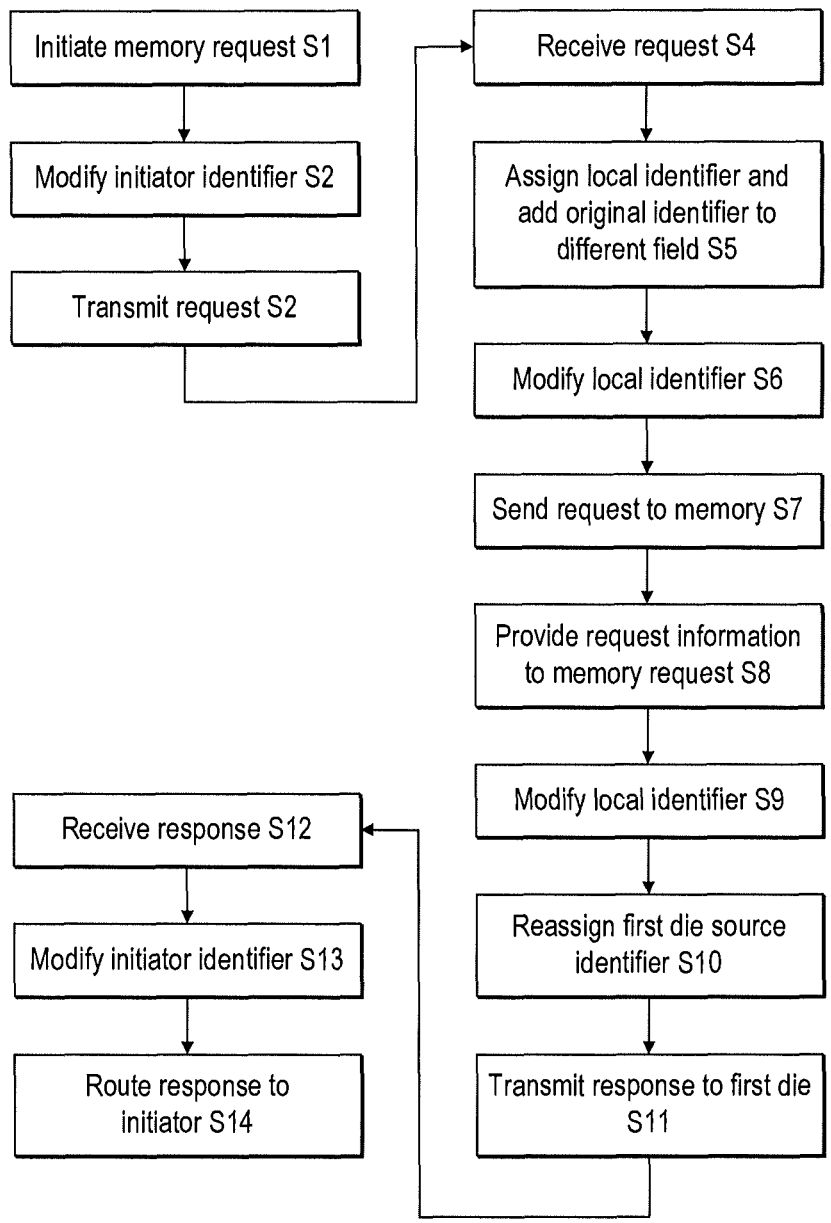
FIG. 5 shows a flow diagram for a method embodying the present invention.

Reference is made to FIG. 5 which shows schematically a method embodying the present invention. The steps shown to the left of FIG. 5 represent steps which are taken in the first die while the steps shown to the right of FIG. 5 represent steps taken in the second die.

In the first step S1, the initiator 100 will initiate the memory request.

In Step S2, the initiator address included in the original request is modified (offset added) to take into account which initiator is providing the request.

In Step S3, the modified request is transmitted to the second die.

In Step S4, the memory request is received at the second die.

In Step S5, a local source address is assigned to the received request and the original source address is included in a further field.

In Step S6, the local source address is modified to add an offset to provide a unique modified local source address.

In Step S7, the request is sent to the memory circuitry.

In Step S8, the memory circuitry provides the requested information in response to the memory request.

In Step S9, the local address is modified to the originally assigned local address, by removing the offset.

In Step S10, the request is modified to re-assign the first die source identifier.

In Step S11, the response is transmitted to the first die.

In Step S12, the response is received by the first die.

In Step S13, the initiator address included in the response is modified to the original initiator identity, by removing the offset.

In Step S14, the response is routed to the initiator.

Embodiments of the present invention may allow for the independency of the two interconnect source identifier maps on the two dies. Embodiments of the present invention may allow the transmit and response sides to the data flows to be treated independently. For example, the first transmit die source identifier is not stored locally in the first die before sending the transactions to the other die. This leads to a simple interconnect architecture which may not require for example outstanding information memory buffers.

Embodiments of the present invention may provide further wires on each interconnect link which represents the size of the source identifier field. A typical value for the number of wires is 10. It should be appreciated that this is by way of example and the size of the source identifier field may be larger or smaller than 10 bits. However, serial transmission of packets may avoid the need for this additional wiring.

It should be appreciated that the orientation of the respective dies with respect to the substrates can be changed as compared to the flip chip orientation shown in FIG. 1b.

In alternative embodiments of the invention, the dies may be arranged in a stacked arrangement, one above the other.

The interface between the two dies is described in preferred embodiments of the invention as being a wired interface, that is provided by a series of wired or wire patterned connections. In alternative embodiments of the invention, the interface may be provided by any suitable means for example an optical interface or a wireless interface.

For clarity a number of the embodiments described show one of the dies as transmitting to the other die which receives the signals. It should be appreciated that in some embodiments of the invention both dies may have the "transmitting" part of the circuitry and the "receiving" part of the circuitry so that the interface is bi-directional. It should be appreciated that in some embodiments at least some of the wires or other interface mechanism are bidirectional. In alternative embodiments the interface may comprise two separate paths, on path for received packets and the other path for transmitted packets.

It should be appreciate there may be more than two dies in some embodiments of the invention.

What is claimed is:

1. Apparatus comprising a die for use in a package comprising said die and at least one further die, said die comprising:
an interface configured to receive a request for a transaction from said further die via an interconnect, said request having a first source identifier, and to transmit a response to said transaction to said further die via said interconnect; and
mapping circuitry configured to receive said first source identifier, said first source identifier identifying a source on said further die of the request for said transaction, and to modify said transaction to comprise a field containing a local source identifier assigned to circuitry on said die as the source identifier for said transaction.

2. The apparatus as in claim 1, wherein said mapping circuitry is configured to modify said received transaction to provide said first source identifier in a further field.

3. The apparatus as in claim 1, wherein said local source identifier comprises a common value for all transactions received from said further die.

4. The apparatus as in claim 1, further comprising routing circuitry configured to route a response to said transaction in said die using said local source identifier to said circuitry on said die.

5. The apparatus as in claim 1, wherein the die further comprises a memory, and said transaction comprises a memory access transaction.

6. The apparatus as in claim 1, further comprising a package comprising the die, said interconnect and said further die.

7. The apparatus as in claim 4, wherein said circuitry having the local source identifies is said mapping circuitry, and wherein said routing circuitry is configured to route said response to said transaction to the mapping circuitry using said local source identifier.

8. The apparatus as in claim 4, wherein said routing circuitry is configured to modify said local source identifier to comprise a modified local source identifier in said transaction, wherein said routing circuitry is configured to use said modified local source identifier to route said response.

9. The apparatus as in claim 4, comprising target circuitry on said die configured to receive said modified transaction via said routing circuitry and to provide a response to said transaction.

10. The apparatus as in claim 8, wherein said routing circuitry is configured to add an offset to said local source identifier to provide said modified local source identifier.

11. The apparatus as in claim 9, wherein said mapping circuitry is configured to modify said received transaction to provide said first source identifier in a further field, and wherein said response comprises said local source identifier as source identifier and said first source identifier in said further field.

12. The apparatus as in claim 11, wherein said mapping circuitry is configured to receive said response and to modify said response to include said first source identifier.

13. The apparatus as in claim 12, wherein said mapping circuitry is configured to output said modified response to said interface for transmission to said further die using said first source identifier.

14. The apparatus as in claim 6, wherein said further die comprises an initiator configured to provide said transaction with said first source identifier and an interface configured to said interconnect.

15. The apparatus as claimed in claim 14, further comprising routing circuitry configured to connect said initiator to said interface and configured to modify an original source identifier in said transaction from said initiator to provide a unique source identifier as said first source identifier and to modify the first source identifier to said original source identifier in a response to said transaction.

16. A method comprising:
receiving at an interface of a die a request for a transaction from a further die, said die and further die being provided in a package, said request having a first source identifier;
receiving the first source identifier, said first source identifier identifying a source on said further die of the request for said transaction;
modifying said transaction to comprise a field containing a local source identifier assigned to circuitry on said die as a source identifier for said transaction; and
transmitting via said interface a response to said transaction from said die to said further die using the first source identifier.

17. Apparatus comprising a die for use in a package comprising said die and at least one further die, said die comprising:
a memory;
an interface configured to receive a memory access transaction request from said further die via an interconnect and to transmit a memory access transaction response to said memory access transaction to said further die via said interconnect; and
mapping circuitry configured to receive the memory access transaction request which includes first source identifier, said first source identifier associated with a source of said memory access transaction request on said further die, and to modify said memory access transaction request to replace the first source identifier with a second source identifier as a source of said memory access transaction request, wherein the second source identifier comprises a unique and fixed identifier associated with circuitry on said die.

18. The apparatus as in claim 17, wherein said unique and fixed identifier for the second source identifier is unique and fixed with respect to said first source identifier such that the second source identifier is the same for all memory access transaction requests received from said further die and is different for requests received from different further dies.

19. The apparatus as in claim 17, further comprising routing circuitry configured to route a response to said memory access transaction request from the memory to said circuitry on said die using the second source identifier.

20. The apparatus as in claim 17, wherein said routing circuitry is configured to modify said second source identifier to comprise modified second source identifier with respect to the response to said memory access transaction request, wherein said routing circuitry is configured to use said modified second source identifier to route said response to said circuitry on said die.

* * * * *